United States Patent
Kholodenko et al.

[11] Patent Number: 5,885,469
[45] Date of Patent: Mar. 23, 1999

[54] TOPOGRAPHICAL STRUCTURE OF AN ELECTROSTATIC CHUCK AND METHOD OF FABRICATING SAME

[75] Inventors: Arnold Kholodenko, San Francisco; Alexander Veytser, Mountain View, both of Calif.

[73] Assignee: Applied Materials, Inc., Santa Clara, Calif.

[21] Appl. No.: 744,039

[22] Filed: Nov. 5, 1996

[51] Int. Cl.6 .................................................. B44C 1/22
[52] U.S. Cl. .............................. 216/11; 156/345; 216/20; 216/33; 216/52
[58] Field of Search ................... 315/111.21; 156/345 P, 156/345 PT, 345 PH, 345 PW, 345 WH; 216/11, 20, 33, 52, 41, 67

[56] References Cited

U.S. PATENT DOCUMENTS

| | | | |
|---|---|---|---|
| 4,384,918 | 5/1983 | Abe | 156/643 |
| 4,399,016 | 8/1983 | Tsukada et al. | 204/192 R |
| 4,502,094 | 2/1985 | Lewin et al. | 361/234 |
| 4,551,192 | 11/1985 | DiMilia et al. | 156/345 |
| 4,565,601 | 1/1986 | Kakehi et al. | 156/643 |
| 4,680,061 | 7/1987 | Lamont, Jr. | 148/1.5 |
| 4,842,683 | 6/1989 | Cheng et al. | 156/345 |
| 4,909,314 | 3/1990 | Lamont, Jr. | 165/80.3 |
| 5,155,652 | 10/1992 | Logan et al. | 361/234 |
| 5,179,498 | 1/1993 | Hongoh et al. | 361/234 |
| 5,238,499 | 8/1993 | van de Ven et al. | 118/724 |
| 5,255,153 | 10/1993 | Nozawa et al. | 361/234 |
| 5,275,683 | 1/1994 | Arami et al. | 156/345 |
| 5,310,453 | 5/1994 | Fukasawa et al. | 156/643 |
| 5,350,479 | 9/1994 | Collins et al. | 156/345 |
| 5,382,311 | 1/1995 | Ishikawa et al. | 156/345 |
| 5,447,595 | 9/1995 | Nakagawa | 156/345 |
| 5,459,632 | 10/1995 | Birang et al. | 361/234 |
| 5,460,684 | 10/1995 | Saeki et al. | 156/345 |
| 5,539,179 | 7/1996 | Nozawa et al. | 219/121.43 |
| 5,656,093 | 8/1997 | Burkhart et al. | 156/345 X |

FOREIGN PATENT DOCUMENTS

| | | |
|---|---|---|
| 0452 222 A1 | 10/1991 | European Pat. Off. . |
| 60-261377 | 12/1985 | Japan . |
| 61-56843(A) | 3/1986 | Japan . |
| 63-194345 | 8/1988 | Japan . |
| 7-18438 | 1/1995 | Japan . |

*Primary Examiner*—William Powell
*Attorney, Agent, or Firm*—Thomson and Moser

[57] ABSTRACT

An apparatus for retaining a workpiece and a method of fabricating same. The apparatus contains an electrostatic chuck having a workpiece support surface. The workpiece support surface has protruded regions and non-protruded regions, where a total surface area of the protruded regions is less than a total surface area of the non-protruded regions. The apparatus contains a pedestal having a surface that supports a flex circuit. The topography of the chuck is formed by either machining the surface of the pedestal prior to adhering and conforming the flex circuit to the surface or sculpting the surface of an electrode within the flex circuit.

22 Claims, 2 Drawing Sheets

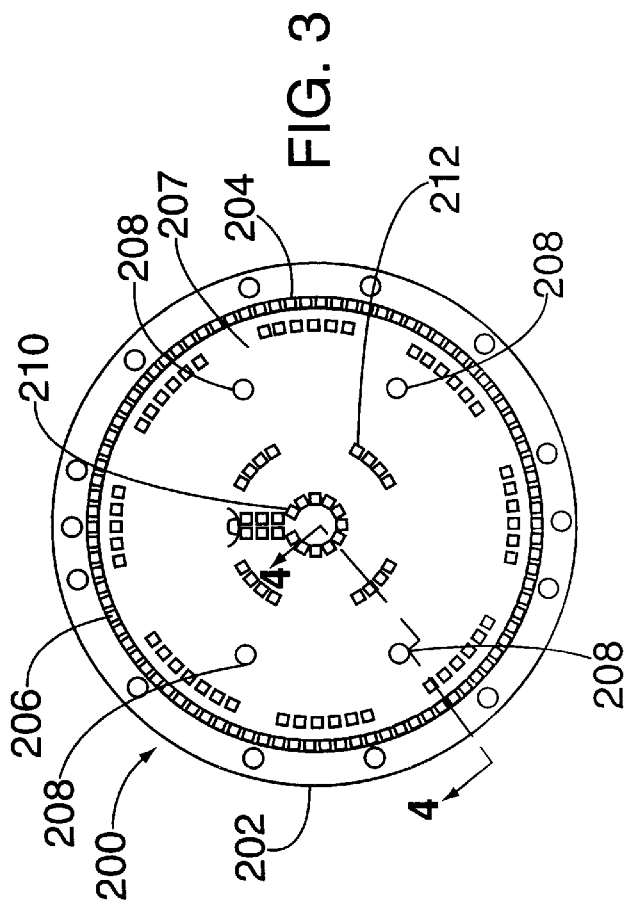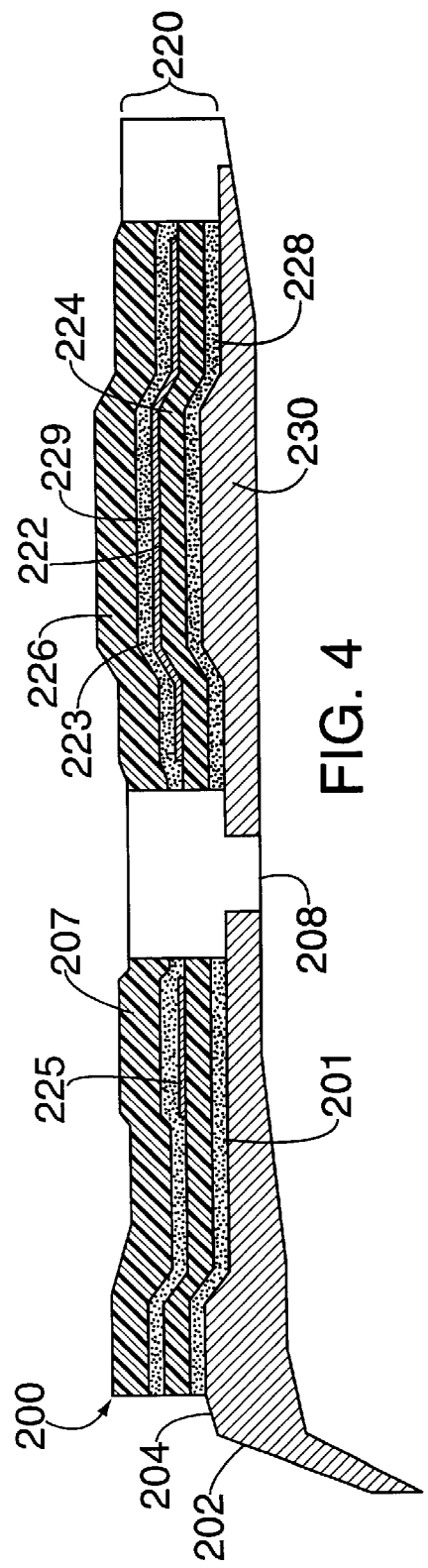

TOPOGRAPHICAL STRUCTURE OF AN ELECTROSTATIC CHUCK AND METHOD OF FABRICATING SAME

BACKGROUND OF THE INVENTION

1. Field of the Invention

The invention relates generally to electrostatic chucks for holding a workpiece and, more specifically, to an improved topographical structure of a support surface of an electrostatic chuck to improve heat transfer gas distribution along the bottom surface of the workpiece.

2. Description of the Background Art

Electrostatic chucks are used for holding a workpiece in various applications ranging from holding a sheet of paper in a computer graphics plotter to holding a semiconductor wafer within a semiconductor wafer process chamber. Although electrostatic chucks vary in design, they all are based on the principal of applying a voltage to one or more electrodes in the chuck so as to induce opposite polarity charges in the workpiece and electrodes, respectively. The electrostatic attractive force between the opposite charges pulls the workpiece against the chuck, thereby retaining the workpiece.

In semiconductor wafer processing equipment, electrostatic chucks are used for clamping wafers to a pedestal during processing. The pedestal may form both a cathode and a heat sink. Electrostatic chucks find use in etching, chemical vapor deposition (CVD), and physical vapor deposition (PVD) applications. More specifically, the electrostatic chuck has a flex circuit covering a support surface of the pedestal. The flex circuit is comprised of a top layer of dielectric material covering a conductive electrode. Below the electrode is a bottom layer of dielectric material. The top and bottom dielectric layers encapsulate the conductive electrode.

In a "unipolar" electrostatic chuck, voltage is applied to the conductive electrode relative to some internal chamber ground reference. Electrostatic force is established between the wafer being clamped and the electrostatic chuck. When the voltage is applied, the wafer is referred back to the same ground reference as the voltage source by a conductive connection to the wafer. Alternatively, a plasma generated proximate the wafer can reference the wafer to ground, although some voltage drop occurs across plasma sheaths that form at both the wafer being clamped and the reference electrode.

The materials and processes used to process a wafer are extremely temperature sensitive. Should these materials be exposed to excessive temperature fluctuations due to poor heat transfer from the wafer during processing, performance of the wafer processing system may be compromised resulting in wafer damage. To optimally transfer heat between the wafer and chuck, a very large electrostatic force is used in an attempt to cause the greatest amount of wafer surface to physically contact the support surface. However, due to surface roughness of both the wafer and the chuck, small interstitial spaces remain between the chuck and wafer that interfere with optimal heat transfer.

To achieve further cooling of the wafer during processing, an inert gas such as Helium is pumped into the interstitial spaces formed between the wafer and the support surface of the chuck. This gas acts as a thermal transfer medium from the wafer to the chuck that has better heat transfer characteristics than the vacuum it replaces. To further enhance the cooling process, the chuck is typically water-cooled via conduits within the pedestal. This cooling technique is known as backside gas cooling.

Since the distribution of Helium to the interstitial spaces is osmotic and the interstitial spaces may not be interconnected, some spaces do not receive any Helium. This condition can lead to a non-uniform temperature profile across the wafer during processing and result in wafer damage. Since effective and uniform heat conduction away from the wafer is an important aspect of the manufacturing process, establishing a uniform Helium layer within the wafer to chuck interface should contribute to uniform heat transfer from the wafer. As such, backside gas cooling art developed based on this premise.

However, the physical limitations of existing technology used to electrostatically clamp large diameter (e.g., 200 mm or more) wafers do not provide the necessary conditions for a uniform distribution of Helium in all of the interstitial spaces beneath the wafer. Existing pedestal topographies limit the effectiveness of the heat transfer process because they have a generally flat top support surface and the wafers have a generally flat bottom surface. Ideally, these flat surfaces would have no defects or deviations so that 100% of the bottom surface of the wafer would contact the top support surface of the pedestal to allow for maximum heat transfer from the wafer to the pedestal. Topographical anomalies create a condition where not all of the wafer is in contact with this support surface. As such, the aforementioned interstitial spaces could form and distribution of the heat transfer gas becomes uneven and uniformity of wafer temperature is compromised. Consequently, during processing, the temperature non-uniformity may result in non-uniform processing and wafer damage.

Therefore, there is a need in the art for an improved topographical structure of an electrostatic chuck that improves temperature uniformity across the wafer without adding considerably to manufacturing costs.

SUMMARY OF THE INVENTION

The disadvantages heretofore associated with the prior art are overcome by an inventive topography of a workpiece support surface of an electrostatic chuck and a method of fabricating same. The inventive topography is created by forming protruded regions and non-protruded regions on the workpiece support surface. The total surface area of the protruded regions is less than that of the non-protruded regions. In use, these protruded regions provide support for a workpiece that is electrostatically clamped to the chuck. Additionally, the electrostatic chuck has at least one heat transfer gas port extending through it to the workpiece support surface. The protruded areas are arranged so that when chucked, the workpiece does not block the flow of heat transfer gas. As such, the gas uniformly penetrates across the entire underside of the wafer.

In a first embodiment of the invention, the protruded regions are formed by a sculpted (or twice etched) electrode contained within the electrostatic chuck. In a second embodiment of the invention, the protruded regions are formed by machining a surface of a pedestal that supports a flex circuit. The flex circuit conforms to the underlying pedestal surface topography providing the workpiece support surface having protruded and non-protruded regions. In the third embodiment of the invention, the protruded regions are formed using a combination of machining the pedestal support surface and formation of sculpted electrode within the chuck.

A method for fabricating the inventive topography includes the steps of etching an electrode pattern onto a layer of copper, etching a topography onto the copper layer, laminating the copper layer between first and second dielectric layers to form a flex circuit and laminating the aforementioned flex circuit to a pedestal surface of the electrostatic chuck. The topography created by the second etching contains protruded regions and non-protruded regions such that the total surface area of the protruded regions is less than the total surface area of the non-protruded regions.

An alternate method of fabricating the inventive topographical structure includes the steps of etching an electrode pattern on a layer of copper, laminating the copper layer between first and second dielectric layers, to form a flex circuit, machining a topography onto the pedestal surface of the electrostatic chuck and adhering the aforementioned flex circuit to the sculpted pedestal surface. The topography created by the machining contains protruded regions and non-protruded regions so that a total surface area of said protruded regions is less than a total surface area of said non-protruded regions. The flex circuit is adhered to the surface of the pedestal and conforms to the topography thereof.

A second alternate method of fabricating a topographical structure of an electrostatic chuck for retaining a workpiece combines the aforementioned steps of machining the pedestal surface and second etching the electrode to create the topography.

This invention fulfills the long felt need for an apparatus that can efficiently clamp a wafer to an electrostatic chuck and provide improved heat transfer characteristics. Specifically, the sculpted electrode and/or machined pedestal surface creates a topography that advantageously distributes and seals heat transfer gas to the backside of a wafer in a more uniform fashion than previously possible. In particular, a substantial and uniform volume of gas is trapped between the wafer and the non-protruded surface of the chuck. The wafer only contacts the surface at the protruded regions and a peripheral rim of the chuck. The improved heat transfer gas distribution provides more uniform cooling of the wafers during processing resulting in a better quality end product.

BRIEF DESCRIPTION OF THE DRAWINGS

The teachings of the present invention can be readily understood by considering the following detailed description in conjunction with the accompanying drawings, in which:

FIG. 3 depicts a top view of an electrostatic chuck with a sculpted support surface and sculpted electrode providing the second embodiment of the inventive topography; and FIG. 4 depicts a cross-sectional view of the electrostatic chuck taken along lines 4—4 of FIG. 3. To facilitate understanding, identical reference numerals have been used, where possible, to designate identical elements that are common to the figures.

DETAILED DESCRIPTION

Figure 1:
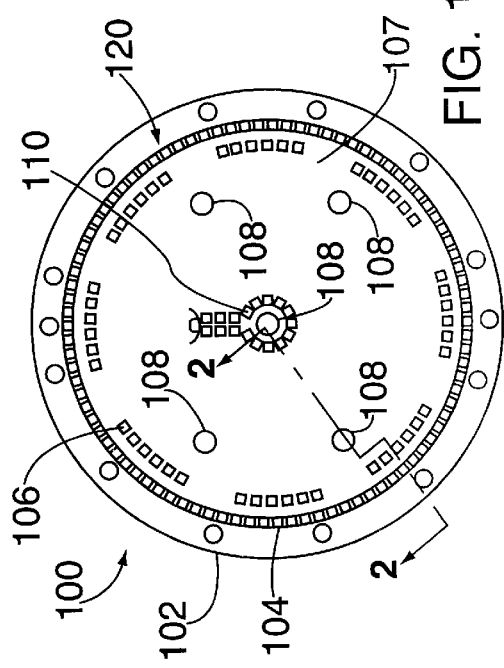
FIG. 1 depicts a top view of an electrostatic chuck with a sculpted electrode providing a first embodiment of the inventive topography for improved heat transfer gas distribution.
Figure 2:
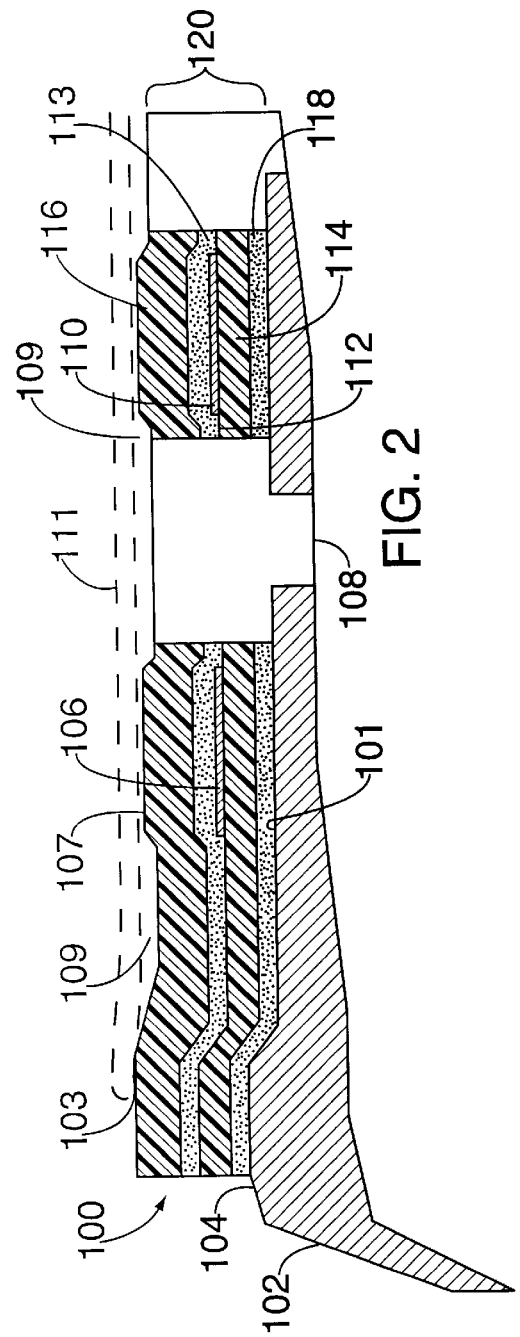
FIG. 2 depicts a cross-sectional view of the electrostatic chuck with sculpted electrode taken along lines 2—2 of FIG. 1.

FIG. 1 depicts a top view of an electrostatic chuck 100 adapted to support and electrostatically retain a workpiece to be processed, such as a semiconductor wafer, on a pedestal 102 within a high density plasma reaction chamber (not shown). FIG. 2 depicts a cross-sectional view of the electrostatic chuck of FIG. 1 taken along line 2—2 with a semiconductor wafer 111 shown in phantom. To best understand the invention, the reader should simultaneously refer to both FIGS. 1 and 2.

For a detailed understanding of the plasma reaction chamber and its operation in processing a wafer, the reader should refer to the drawings and the detailed description contained in U.S. Pat. No. 4,842,683, issued Jun. 27, 1989 and incorporated herein by reference. That patent discloses a illustrative biased, high density plasma etch reaction chamber manufactured by Applied Materials, Inc. of Santa Clara, Calif.

The electrostatic chuck 100 contains an inventive topographical surface created by a sculpted flex circuit 120 upon which the wafer 111 rests. Specifically, the chuck 100 contains a pedestal 102 with a surface 101 upon which the flex circuit 120 is adhered. The flex circuit contains a first dielectric layer 114, a conductive layer 112 and a second dielectric layer 116. The first dielectric layer 114 is attached to the pedestal surface 101 by a first adhesive layer 118.

More specifically, the flex circuit 120 is fabricated using conventional, flexible printed circuit fabrication techniques with materials available from a flexible circuit board manufacturer such as Rogers Corporation of Chandler, Ariz. Specifically, a conductive layer 112 of uniform 5.08 mm thickness copper 112 is used to form the sculpted electrode. The conductive layer 112 is masked to outline the desired electrode pattern and then etched (e.g., wet etched) to create the electrode pattern. The conductive layer 112 is then masked and etched again to create a desired topography in one surface of the electrode.

The conductive layer 112 is then embedded between a first dielectric layer 114 and a second dielectric layer 116. The conductive layer 112 is placed on top of the first dielectric layer 114. A first laminating adhesive layer 113 is then applied over the conductive layer 112. Finally, the second dielectric layer 116 is placed on top of the first laminating adhesive layer 113 and the layers are pressed together to form the flex circuit 120. A second laminating adhesive layer 118 is then applied to the pedestal surface 101. The flex circuit 120 is pressed over the second laminating adhesive layer 118 thereby affixing it to the pedestal 102. The second dielectric layer conforms to the topographical design etched into the conductive layer 112 to form a sculpted wafer support surface 107.

Preferably, the dielectric material used is a sheet of polyimide sold under the brandname UPILEX by Rogers. UPILEX is a registered trademark of UBE Industries, Ltd. of Yamaguchi, Japan. The preferred thickness of the first dielectric layer 114 is 25.4 mm and the preferred thickness of the second dielectric layer 116 is 50.8 mm. The preferred thickness of the first and second laminating adhesive layers 113 and 118 is 12.7 mm.

The pedestal 102 is provided with a raised rim 104 at its outer diameter. The diameter of the rim 104 is approximately equal to the diameter of the wafer to be processed. As such, the edge of the flex circuit 120 follows the contour of the rim 104 such that the wafer 111 is supported in part by the rim. The chuck also contains at least one port 108 for conducting heat transfer gas through the chuck to the bottom surface of the wafer. When the wafer 111 is placed on the chuck, it is supported solely by the rim 104. As such, a volume of space 109 is created below the wafer and above the wafer support surface 107. When power is applied to the electrode 112, it creates an electrostatic force which draws the wafer toward the wafer support surface 107. This electrostatic force is also known as a clamping force. Since the dielectric material of the flex circuit 120 is semi-pliant, a relatively tight seal is created at the rim to wafer contact area 103. As such, the volume of space 109 between the wafer and the flex circuit covered wafer support surface 107 is sealed from the chamber vacuum when the wafer 111 is clamped to the chuck 100.

To create a topography for the wafer support surface 107 upon which the wafer rests when clamped, the electrode 112 is preferably etched into a series of one or more rims 106 and 110 rising above a common level. The rims 106 and 110 may be continuous or broken into radial segments about the pedestal 102. After the electrode 112 is etched to a specific topographical pattern and sealed between the dielectric layers 114 and 116, the results is a topography across the wafer support surface 107 that lends additional support to the clamped wafer 111. Specifically, the wafer 111 is supported at the outer diameter rim contact area 103 and at least one other point radially inward therefrom (e.g., rims 106 and 110).

To achieve cooling of the wafer during processing, a heat transfer gas, preferably Helium, is pumped into the volume 109 between the wafer and the wafer support surface 107 via the heat transfer gas ports 108. With the addition of the rims 106 and 110, the interstitial spaces between the wafer and the wafer support surface 107 are eliminated. Thus, the surface area of the wafer exposed solely to the Helium is greatly increased. This contributes to greater and more uniform Helium distribution than experienced by the prior art. As a result, heat transfer from the wafer to the pedestal is uniform. The improved topography is capable of reducing wafer temperature nonuniformity to approximately 5° C. across the wafer.

An alternate method of constructing the inventive topography is by machining the pedestal surface 101 prior to covering it with a flex circuit. Turning to FIGS. 3 and 4, a similar chuck construction 200 is shown as that depicted in FIGS. 1 and 2 including outer diameter rim 204, heat transfer gas ports 208 and a flex circuit 220. As with the previous embodiment, the flex circuit contains a conductive layer 222 that is etched at one or more locations 225 and 229 to form the electrode. The conductive layer is encased in first and second dielectric layers 224 and 226 using a first laminating adhesive layer 223 and secured to the pedestal surface 201 using a second laminating adhesive layer 228. The topographical structure of the pedestal 202 is further enhanced by machining of the pedestal surface 201 to create an additional rim 230 which supports the wafer. The pedestal surface 201 is machined to a specific topographical pattern which allows the flex circuit above it to take the shape of the pattern. Specifically, a rim of approximate height 50.8 mm. and width 2.21 cm is shown as a preferred pattern in FIG. 4. The height may be altered depending on the thickness of the dielectric material and electrode used. The width may be altered depending on the desired amount of area of the wafer to be exposed to the backside gas to provide adequate cooling. It should be noted that although the etched electrode and machined support surfaces are shown together in FIGS. 3 and 4, they may be used either separately or in conjunction with one another to form the desired topography and achieve particular gas distribution and cooling characteristics.

The wafer support surface or electrode may also be formed as a pattern of ribs (i.e., extending radially outward, a series of concentric circles or segments or a combination of both). The pattern lends additional support to the wafer beyond that provided by the outer diameter rim as well as contributing to the uniform distribution and flow of Helium to all areas of the wafer. For example, if a wafer were placed on a conventional support surface, it may block one or more of the Helium ports because of wafer flexing. The ribs of the present invention can be patterned to maintain the wafer above the ports to avoid blockage and improve gas distribution. However, in keeping with the teachings of the invention, the area of the wafer physically contacting the support surface at the chuck is substantially less than the area of the wafer that is exposed to the cooling gas.

Although various embodiments which incorporate the teachings of the present invention have been shown and described in detail herein, those skilled in the art can readily devise many other varied embodiments that still incorporate these teachings.

What is claimed is:

1. Apparatus for retaining a workpiece comprising:
   an electrostatic chuck having a workpiece support surface, said workpiece support surface containing protruded regions and non-protruded regions, where a total surface area of said protruded regions is less than a total surface area of said non-protruded regions.

2. The apparatus of claim 1 wherein said electrostatic chuck further comprises a peripheral rim rising above the workpiece support surface.

3. The apparatus of claim 2 wherein said protruded regions are located radially inward of the peripheral rim.

4. The apparatus of claim 1 wherein the workpiece support surface contains at least one heat transfer gas port extending through the electrostatic chuck to the workpiece support surface.

5. The apparatus of claim 4 wherein the protruded regions are arranged to prevent the workpiece from blocking a flow of heat transfer gas from the heat transfer gas port.

6. The apparatus of claim 1 wherein the protruded regions provide support for the workpiece.

7. The apparatus of claim 1 wherein at least one of the protruded regions is formed by a sculpted electrode contained within the electrostatic chuck.

8. The apparatus of claim 1 wherein the electrostatic chuck contains a pedestal having a surface and at least one of the protruded regions are formed by machining the surface of the pedestal.

9. The apparatus of claim 8 wherein at least one other of the protruded regions is formed by a sculpted electrode contained within the electrostatic chuck.

10. Apparatus for retaining a workpiece comprising:
    a pedestal having a surface;
    a flex circuit, positioned atop said surface of said pedestal, containing an electrode laminated between first and second dielectric layers, where said electrode has a sculpted surface to provide a workpiece support surface having protruded regions and non-protruded regions, where a total surface area of said protruded regions is less than a total surface area of said non-protruded regions.

11. The apparatus of claim 10 wherein said pedestal further comprises a peripheral rim.

12. The apparatus of claim 11 wherein said protruded regions are located radially inward of the peripheral rim.

13. The apparatus of claim 12 wherein the workpiece support surface contains at least one heat transfer gas port extending through the pedestal and flex circuit to the workpiece support surface.

14. The apparatus of claim 13 wherein the protruded regions are arranged to prevent the workpiece from blocking a flow of heat transfer gas from the port.

15. The apparatus of claim 10 wherein the surface of the pedestal is machined to form at least one of the protruded regions.

16. Apparatus for retaining a workpiece comprising:
a pedestal having a sculpted surface having protruded regions and non-protruded regions;
a flex circuit, positioned atop said surface of said pedestal, containing an electrode laminated between first and second dielectric layers, where said flex circuit conforms to the sculpted surface to provide a workpiece support surface having protruded regions and non-protruded regions, where a total surface area of said protruded regions is less than a total surface area of said non-protruded regions.

17. The apparatus of claim 16 wherein said pedestal further comprises a peripheral rim.

18. The apparatus of claim 17 wherein said protruded regions are located radially inward of the peripheral rim.

19. The apparatus of claim 16 wherein the workpiece support surface contains at least one heat transfer gas port extending through the pedestal and flex circuit to the workpiece support surface.

20. The apparatus of claim 19 wherein the protruded regions are arranged to prevent the workpiece from blocking a flow of heat transfer gas from the port.

21. A method of fabricating a topographical structure of an electrostatic chuck for retaining a workpiece comprising the steps of:

a first etching of an electrode pattern on a layer of conductive material;

a second etching of a topography on said layer of conductive material;

laminating the conductive layer between first and second dielectric layers to form a flex circuit having a topography conforming to the topography of the conductive material layer, wherein the topography contains protruded regions and non-protruded regions, and a total surface area of said protruded regions is less than a total surface area of said non-protruded regions; and adhering said flex circuit to a surface of a pedestal.

22. A method of fabricating a topographical structure of an electrostatic chuck for retaining a workpiece comprising the steps of:

machining a topography onto a surface of a pedestal having protruded regions and non-protruded regions; and adhering, to said surface, a flex circuit, said flex circuit conforms to the topography of the surface of the pedestal to form a workpiece support surface having protruded regions and non-protruded, wherein a total surface area of said protruded regions is less than a total surface area of said non-protruded regions.

* * * * *

US005885469B1

REEXAMINATION CERTIFICATE (4134th)

United States Patent [19]
Kholodenko et al.

[11] B1 5,885,469
[45] Certificate Issued Aug. 8, 2000

[54] TOPOGRAPHICAL STRUCTURE OF AN ELECTROSTATIC CHUCK AND METHOD OF FABRICATING SAME

[75] Inventors: Arnold Kholodenko, San Francisco; Alexander Veytser, Mountain View, both of Calif.

[73] Assignee: Applied Materials, Inc., Santa Clara, Calif.

Reexamination Request:
No. 90/005,429, Aug. 9, 1999

Reexamination Certificate for:
Patent No.: 5,885,469
Issued: Mar. 23, 1999
Appl. No.: 08/744,039
Filed: Nov. 5, 1996

[51] Int. Cl.[7] .................................................... B44C 1/22
[52] U.S. Cl. ................... 216/11; 156/345; 216/20; 216/33; 216/52
[58] Field of Search .......................... 156/345 P, 345 PT, 156/345 PH, 345 PW, 345 WH; 216/11, 20, 33, 52, 41, 67; 361/212, 230, 234

[56] References Cited

U.S. PATENT DOCUMENTS

| | | | |
|---|---|---|---|
| 4,551,192 | 11/1985 | Di Milia et al. | 156/345 |
| 5,456,756 | 10/1995 | Ramaswami et al. | 118/721 |
| 5,530,616 | 6/1996 | Kitabayashi et al. | 361/234 |
| 5,583,736 | 12/1996 | Anderson et al. | 361/234 |

FOREIGN PATENT DOCUMENTS

| | | |
|---|---|---|
| 0 683 505 A1 | 11/1995 | European Pat. Off. . |
| 0 693 771 A1 | 1/1996 | European Pat. Off. . |
| 1-241839 | 9/1989 | Japan . |

*Primary Examiner*—William A. Powell

[57] ABSTRACT

An apparatus for retaining a workpiece and a method of fabricating same. The apparatus contains an electrostatic chuck having a workpiece support surface. The workpiece support surface has protruded regions and non-protruded regions, where a total surface area of the protruded regions is less than a total surface area of the non-protruded regions. The apparatus contains a pedestal having a surface that supports a flex circuit. The topography of the chuck is formed by either machining the surface of the pedestal prior to adhering and conforming the flex circuit to the surface or sculpting the surface of an electrode within the flex circuit.

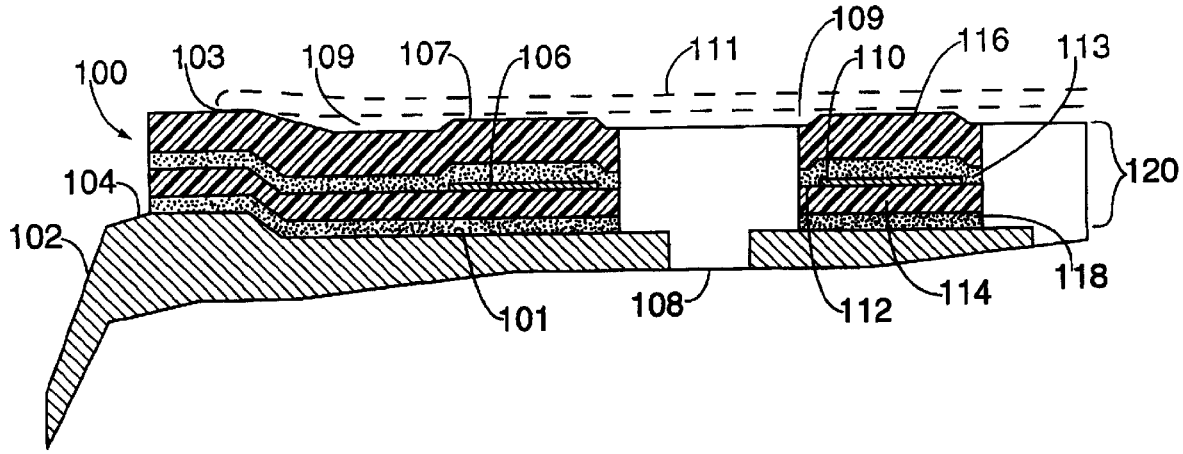

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 10–22 is confirmed.

Claim 7 is cancelled.

Claim 1 is determined to be patentable as amended.

Claims 2–6, 8 and 9, dependent on an amended claim, are determined to be patentable.

1. Apparatus for retaining a workpiece comprising:

an electrostatic chuck having a workpiece support surface, said workpiece support surface containing protruded regions and non-protruded regions, where a total surface area of said protruded regions is less than a total surface area of said non-protruded regions *wherein at least one of the protruded regions are formed by a sculpted electrode contained within the electrostatic chuck.*

* * * * *